United States Patent
Hung

(12) United States Patent (10) Patent No.: US 6,467,640 B1
(45) Date of Patent: Oct. 22, 2002

(54) STANDING BOX STRUCTURE WITH MULTI-DIRECTION OPENING DOORS

(76) Inventor: Kuo-Chuan Hung, P.O. Box No. 6-57, Chung-Ho City, Taipei Hsien 235 (TW)

( * ) Notice: Subject to any disclaimer, the term of this patent is extended or adjusted under 35 U.S.C. 154(b) by 0 days.

(21) Appl. No.: 09/941,672

(22) Filed: Aug. 30, 2001

(51) Int. Cl.[7] .................................................. B65D 6/00
(52) U.S. Cl. ..................... 220/4.02; 220/660; 220/668; 174/50
(58) Field of Search ............................... 220/4.02, 467, 220/668, 660, 3.8; 174/50

(56) References Cited

U.S. PATENT DOCUMENTS

| | | | | |
|---|---|---|---|---|
| 5,147,981 A | * | 9/1992 | Buet et al. ............. | 220/4.02 X |
| 6,066,802 A | * | 5/2000 | Reinke et al. ......... | 220/4.02 X |
| 6,145,683 A | * | 11/2000 | Taniguchi ................ | 220/4.02 |
| 6,348,655 B1 | * | 2/2002 | Wright ........................ | 174/50 |
| 6,390,317 B1 | * | 5/2002 | Polloni ................. | 220/4.02 X |

* cited by examiner

Primary Examiner—Steven Pollard

(57) ABSTRACT

A standing box structure with multi-direction opening doors, more particularly, alignment portions that are installed relatively to a front panel and two side panels in the box structure, which is supported by two fixed horizontal bars and fastened by alignment portions that can loosen one side of the box, turn, and open. The present invention provides a special feature of time saving efficient and convenient in the maintenance and installation of wire circuits.

5 Claims, 8 Drawing Sheets

STANDING BOX STRUCTURE WITH MULTI-DIRECTION OPENING DOORS

BACKGROUND OF THE INVENTION

1. Field of the Invention

The present invention is to provide a standing box with multi-direction opening doors, more particularly to a structure in which all panels of the box can be opened, and with the help of two fixed horizontal bars, and one side of the box itself as a pivot which enabling it to turn the box, making circuit installation free and convenient.

2. Description of the Prior Art

The box structure herein is directed to electronic appliances, or equipment of circuit parts. It is a six-sided box made of metal, with a front door. Inside the box there are several horizontal or vertical bars with structures of angle frames for circuit boards. There is only one front door on the traditional box structure of the kind, all circuiting and maintenance works have to go through the same door which hampers the work especially of those in the corners or comparatively deeper part of the box which can't be reach easily. This is the draw-back of the traditional box as it is time consuming and has very little efficiency when it comes to installation and maintenance.

SUMMARY OF THE INVENTION

The primary objective of the present invention is to provide a structure in which all doors (front, side, back doors and the box itself) can be turned or opened, making it time saving and convenient when installation or maintenance is needed.

To enable a further understanding of the feature of the present invention, the brief description of the drawing below is followed by the detailed description of the preferred embodiments.

DETAILED DESCRIPTION OF THE PREFERRED EMBODIMENTS

Figure 1:
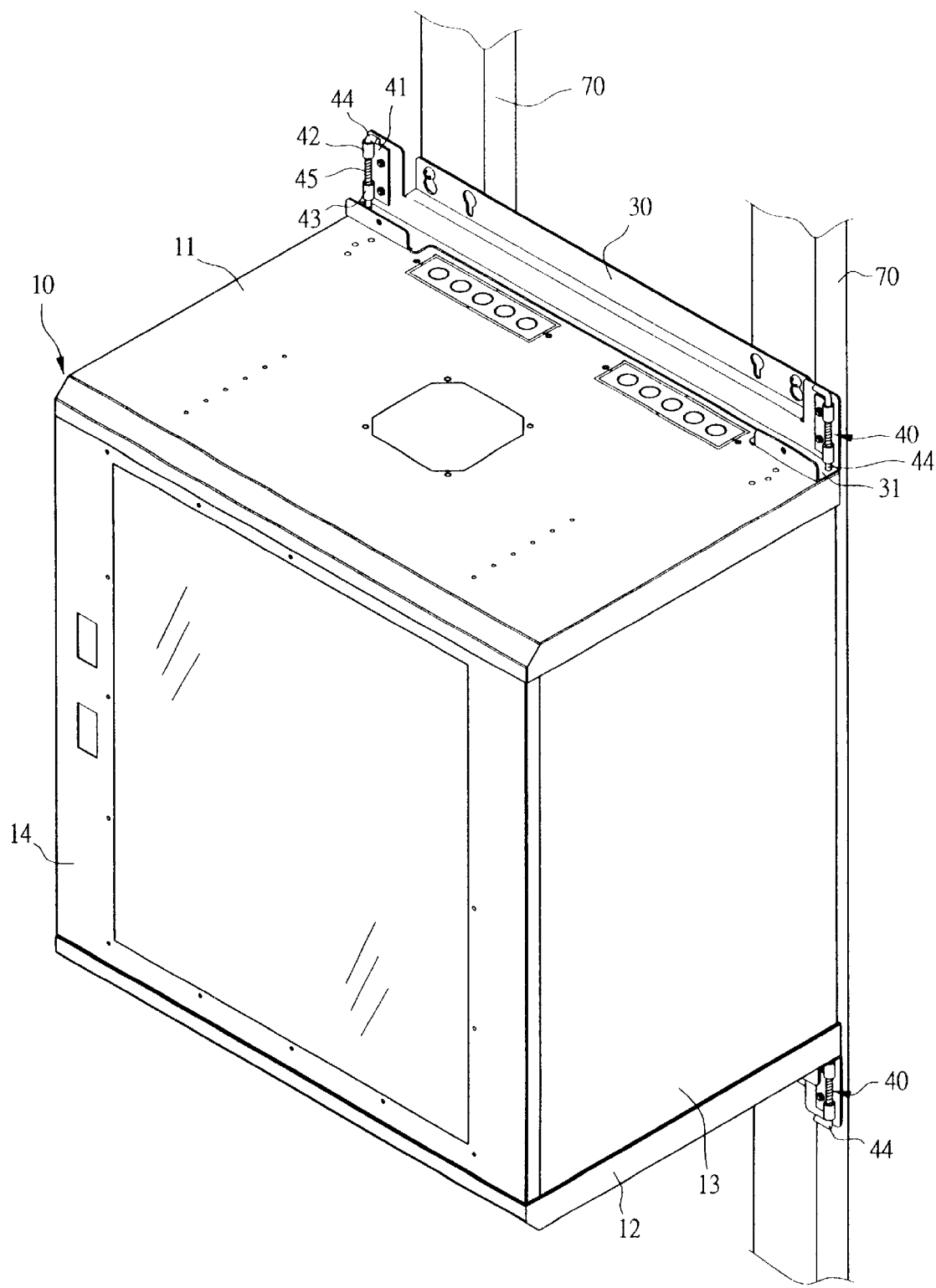
FIG. 1 is a perspective view of the present invention in an assembled state.
Figure 4:
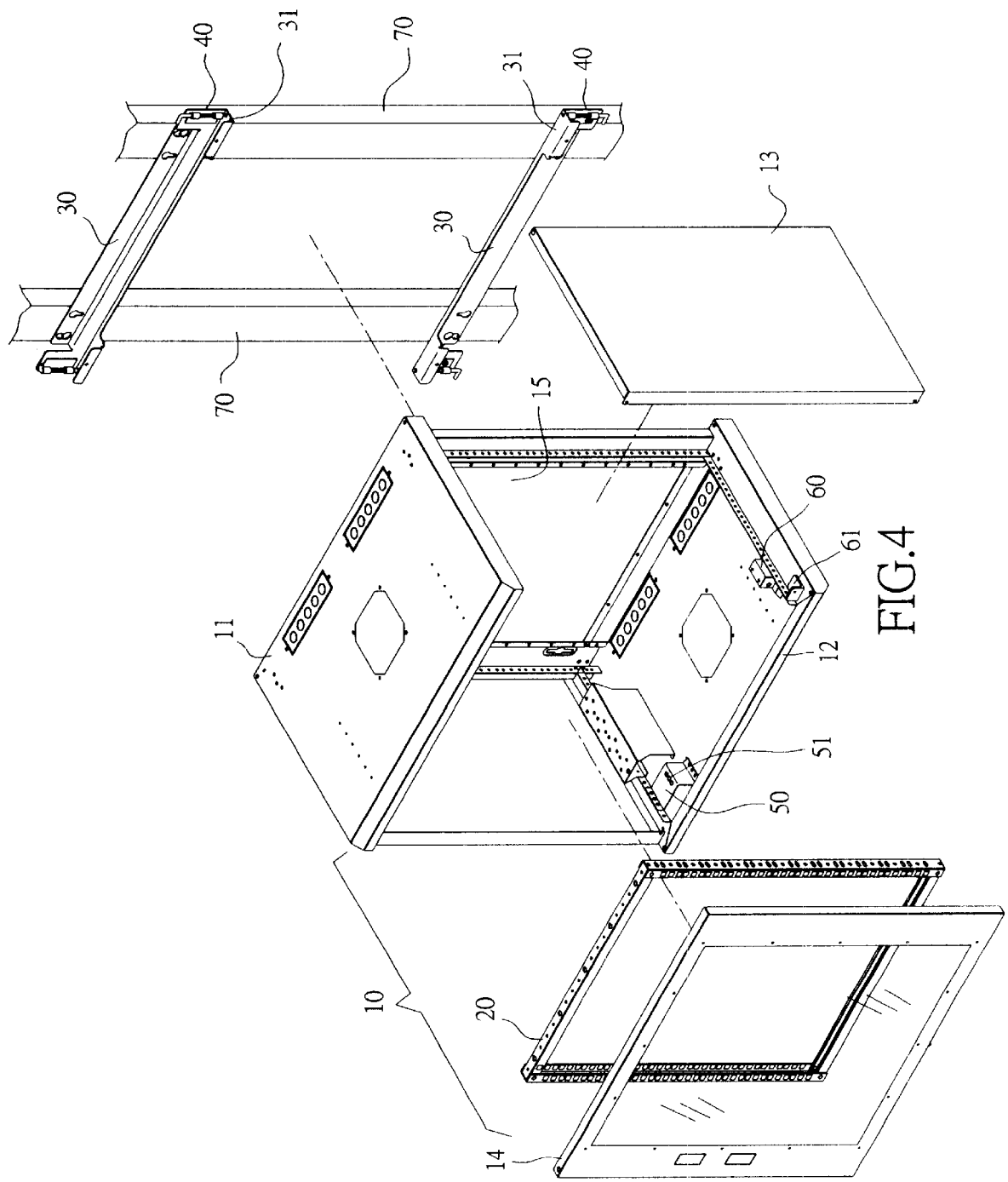
FIG. 4 is an exploded perspective view of the present invention.

As shown in FIG. 1 and FIG. 4, the structure of the present invention is screw fastened between two vertical frames 70 separately with two fixed horizontal bars 30 which on both sides there is a reversed-n shape bottom board 31 on which there are alignment portions 40 which tightly lock four corners from back of box 10 into position; wherein, a top panel 11, a bottom panel 12, a front panel 14, two side panels 13 and a back panel 15 are joint together forming a six-sided closed box 10.

Figure 2:
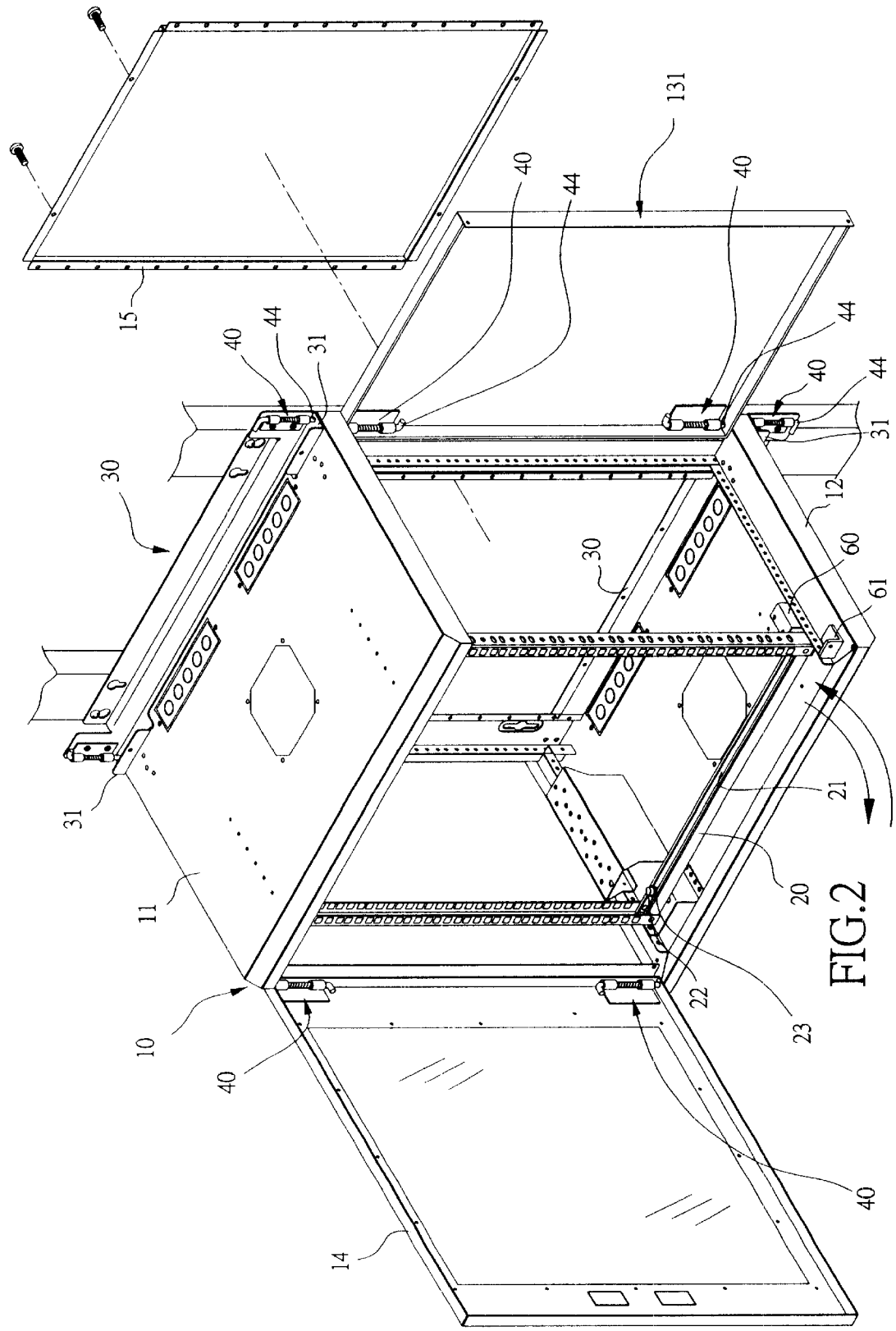
FIG. 2 is a perspective view of the present invention in the state of opening of the front, side and back panel.
Figure 5:
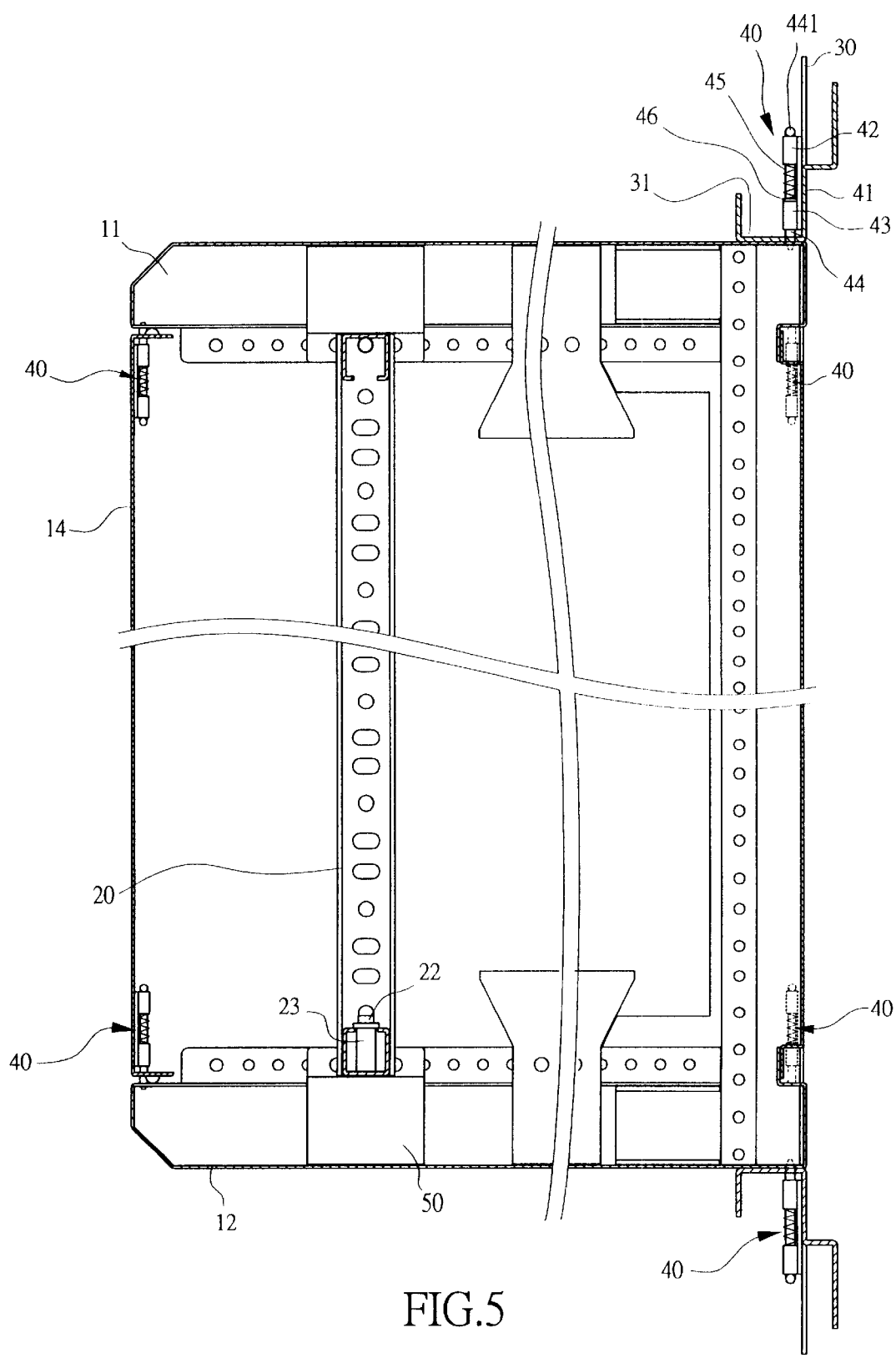
FIG. 5 is a side sectional view of the present invention

As shown in FIG. 2 and FIG. 5, on one side of the front panel 14 and of the side panels 13 respectively at top end and bottom end, there are alignment portions 40 which lock the top panel 11 and bottom panel 12 in place.

Figure 6:
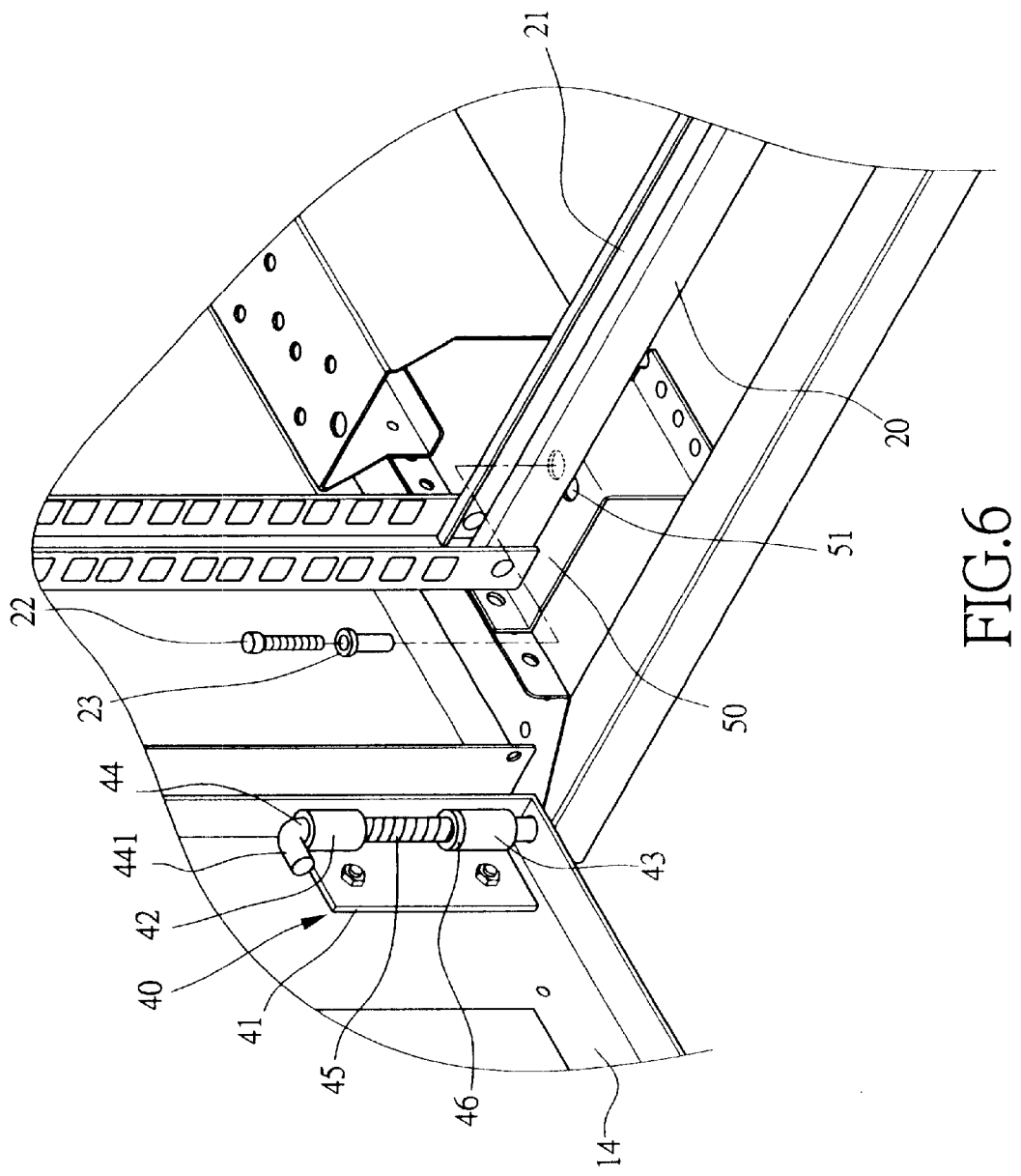
FIG. 6 is an enlarged view of the present invention illustrating bottom left of the front panel.

As shown in FIG. 5 and FIG. 6, each alignment portion 40 consists of an alignment board 41 which on one side is equipped with two pivot caps 42, 43. An inserting bar 44 with a curved handle 441 is inserted into the pivot caps 42,43 between which there is a elastic part 45 and a washer 46 is designed to place against the end of the elastic part 45 thereby supports the inserting bar 44 in a protruding state.

Figure 3:
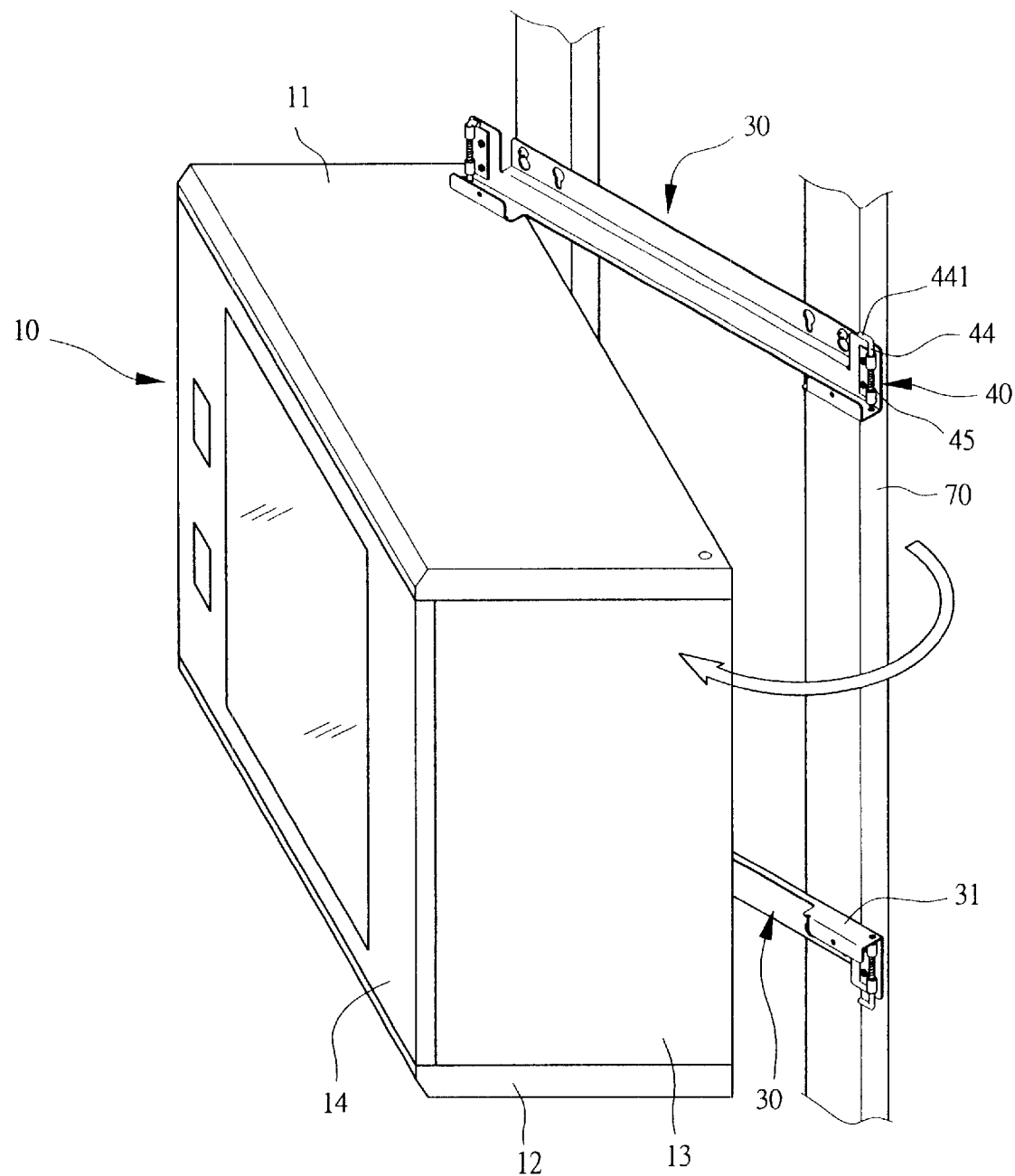
FIG. 3 is a perspective view of the present invention in the state of turning the box.

As shown in FIG. 1 and FIG. 5, the alignment portions 40 located on both sides of the upper and lower horizontal bar 30 are locked into the top panel 11 and bottom panel 12 with the ends of the inserting bars 44. As shown in FIG. 3, when the upper and lower alignment portions 40 on the same side of the box 10 are pulled outward and loosened, the alignment portions 40 on the other side will work as a pivot to help one side of the box 10 to disconnect from the vertical frame 70 enabling it to be turned and opened.

Figure 8:
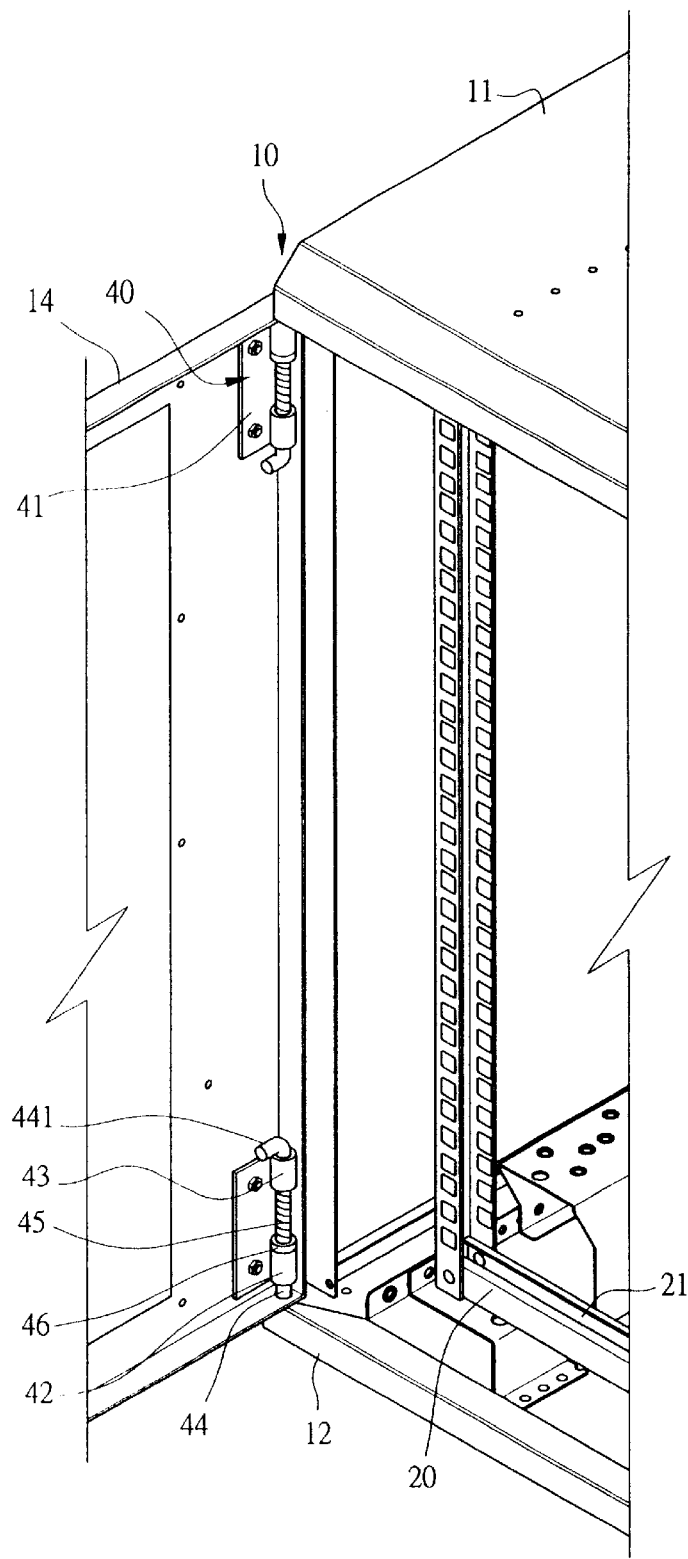
FIG. 8 is a partial perspective view of the present invention illustrating the structure of pivot inside of the front Panel.

As shown in FIG. 2, FIG. 6 and FIG. 8, when the said alignment portions 40 are applied respectively on the top and bottom of one side of the front panel 14, and inserted into the top panel 11 and bottom panel 12, of the front panel 14 as a pivot connection, enabling it to open the same way using the alignment portions 40 as a pivot.

As shown in FIG. 2, for the side panels 13, the same can be applied. When alignment portion 40 are fixed on top and bottom of one side of the side panels 13, wherein, the inserting bars 44 are then inserted into the top panel 11 and bottom panel 12, so that the side panels 13 can be turned and opened in the same manner as that of the front panel.

Figure 7:
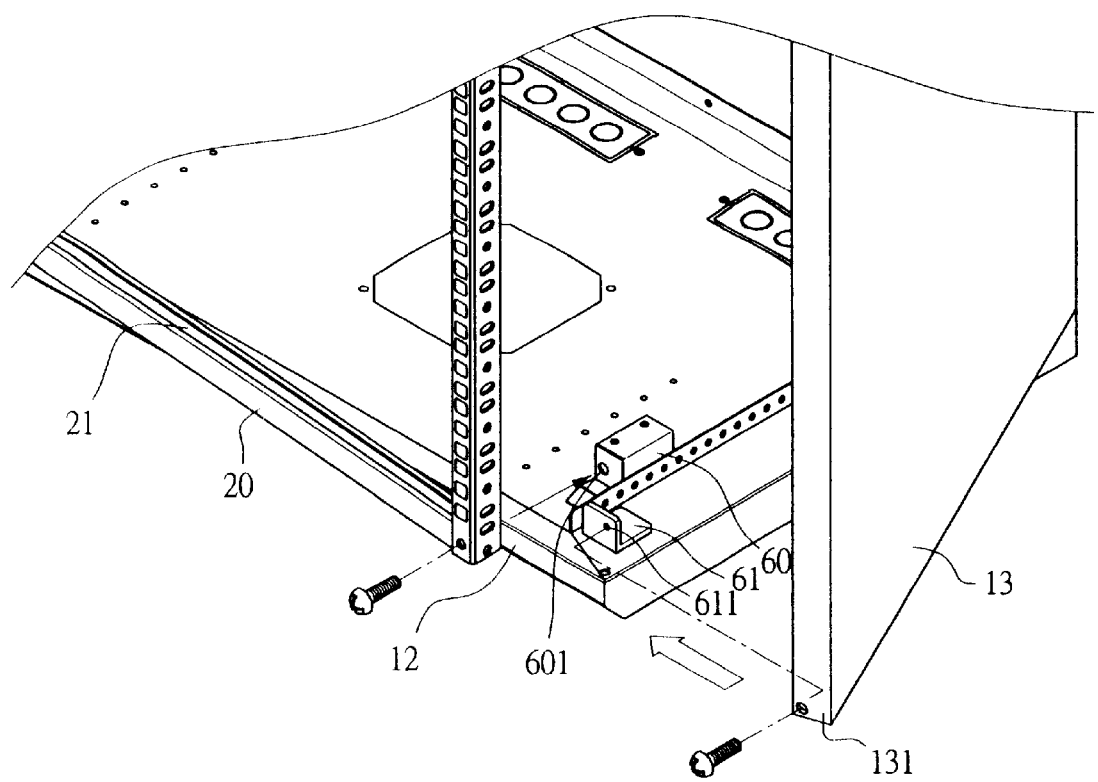
FIG. 7 is a partial perspective view of the present invention illustrating the mounting and dismounting of the circuit frame and side panels.

As shown in FIG. 7, a bent blocking L shape slat 61 is installed on one side of the bottom panel 12 and a lock hole 611 is on top of it. When pressing the side panel 13 onto one side of the box 10, a bottom portion 131 of the side panel 13 reaching the front of the bent blocking L shape slat 61, so as to screw fasten them together with a bolt. The back panel 15 as shown in FIG. 2, is seldom used, and so it is usually fixed tight with screws.

As shown in FIG. 2, the invention herein consists of several alignment portions 40 utilized as the connecting structures of the box 10. Therefore, the front panel 14 and side panels 13 pivotally to be opened, making it convenient to perform maintenance work and installation of circuit inside of the box 10.

As shown in FIG. 2, FIG. 4 and FIG. 6, a rectangular frame structure made of holed circuit frames 20 are install inside of the box 10 and a groove 21 mounting at the bottom of the frame structure. One side of the circuit frames 20 is connected to one inner side of the box 10 by a double angle supporting stand 50 on which surface there are bolt holes 51 and the bottom side of the circuit frame 20 is placed on top of the said supporting stand 50. As shown in FIG. 5 and FIG. 6, a axle tube 23 is placed against the bottom of the double angle supporting stand 50 running through the bottom of the groove 21 of the circuit frame 20. Furthermore, a pivot is formed when one bolt 22 goes through the axle tube 23 and the bolt hole 51 of the double angle supporting stand 51, enabling the circuit frame 20 to be suitably opened and closed by applying the structure.

As shown in FIG. 2 and FIG. 7, a block 60 with lock hole 611 is installed relatively at a free end of the circuit frame 20 inside of the box 10. When enclosing the circuit frame 20 within the box 10, the circuit frame 20 is accordingly located adjacent to block 60 by fastening with a screw.

The present invention has been very well thought and has the following advantages:

Mainly all doors can be conveniently opened, making circuit installation more accurate, and efficient.

A smooth connection of flexible circuit frames by a structure that works together with the said supporting stand, pivot and bolts.

Two fixed horizontal bars that work together with the alignment portions, mounting the box onto the two vertical frames. When the alignment portions are put away on one side, the other side will be used as a pivot which enables the box to be turned and opened.

The present invention is a result of the inventor's persevering attitude, continuous hard work and development, which is believed to meet all patent requirements and is hereby submitted to the patent examiner for reviewing and granting of commensurate patent right.

What is claimed is:

1. A standing box structure with multi-direction opening doors, comprising a top panel, a bottom panel, a front panel, two side panels and a back panel, forming a six-sided assembled box between two vertical frames, wherein, a circuit frame structure is installed inside the said box, are characterized in that:

two fixed horizontal bars are installed between the two vertical frames and alignment portions are disposed at each end of the two horizontal bars in order to screw fastening four corners of the back panel, wherein, one side of the front panel and both of the two side panels are pivotally connected by the alignment portions at top and bottom end respectively fastening the top panel and the bottom panel;

the alignment portions comprise of a fixed board and two pivot caps are installed on each side thereof; a curved handled inserting bar is inserted into each of the pivot caps, an elastic portion is placed between the two caps and a washer which is placed against the end of the elastic portion thereby supports the inserting bar in a protruding state;

the alignment portions located on two sides of upper and lower fixed horizontal bars are attached with the end of inserting bar into the top and the bottom panels, when the alignment portions on one side of the box are pulled outward and released, the alignment portions on the other side are used as pivots, enabling the box to dismount from the vertical frame, turn, and open for circuit installation work;

the said alignment portions are installed on one side of the front panel at the top and bottom thereof, wherein the inserting bars are inserted into the top and bottom panels, enabling the front panel pivotally opened by the alignment portions;

the said alignment portions are installed on one side of the two side panels at the top and bottom thereof, wherein the inserting bars are inserted into the top and bottom panels, enabling the two side panels pivotally opened by the alignment portions.

2. A standing box structure with multi-direction opening doors in accordance with claim 1, wherein, a bent L shape blocking slat is installed on one side of the bottom panel and a locking hole is on top of the bent L shape blocking slat; by pressing the side panel against the box, a bottom portion of the side panel attach to front of the said bent L shape blocking slat, thereby screw fastening the side panels through the locking hole.

3. A standing box structure with multi-direction opening doors in accordance with claim 1, wherein, a groove at the bottom of the circuit frame; in one inner corner of the box, a double angle supporting stand which has a lock holed surface on which one bottom side of the circuit frame is placed; a tube is placed against the bottom of the supporting stand, running through the bottom of the groove of the circuit frame; a pivot is formed with one bolt that goes through the axle tube and the hole of the supporting stand forming a pivot.

4. A standing box structure with multi-direction opening doors in accordance with claim 1, wherein, on both sides of the fixed horizontal bars, a reversed n shape bottom boards at which the alignment portions are separately installed to strengthen the structure on both sides of the fixed horizontal bars.

5. A standing box structure with multi-direction opening doors in accordance with claim 1, wherein, a block with locking hole is made of bent slat and is able to be substituted by solid block, which is installed relatively at a free end of the circuit frame inside of the box; by enclosing the circuit frames within the box, the circuit frames are located adjacent the block by fastening with a screw.

* * * * *